United States Patent [19]

Campi

[11] 4,340,654
[45] Jul. 20, 1982

[54] DEFECT-FREE PHOTOMASK

[76] Inventor: James G. Campi, 709 Blackfoot Ct., San Jose, Calif. 95123

[21] Appl. No.: 290,165

[22] PCT Filed: Jun. 18, 1981

[86] PCT No.: PCT/US81/00825
§ 371 Date: Jul. 16, 1981
§ 102(e) Date: Jul. 16, 1981

[87] PCT Pub. No.: WO81/03628
PCT Pub. Date: Dec. 24, 1981

Related U.S. Application Data

[63] Continuation-in-part of Ser. No. 160,978, Jun. 19, 1980, abandoned.

[51] Int. Cl.$^3$ .............................................. B05D 3/06
[52] U.S. Cl. ...................................... 430/5; 427/53.1; 427/140; 430/945
[58] Field of Search ................... 427/8, 10, 53.1, 140, 427/142; 430/5, 297, 945; 346/76 L

[56] References Cited

U.S. PATENT DOCUMENTS 3,089,732  5/1974  Chandross et al. .
3,873,339  3/1975  Hudson .
4,122,240  10/1978  Banas et al. .
4,142,892  3/1979  Paal .

OTHER PUBLICATIONS

Roshon et al, "IBM Tech. Disc. Bull.", vol. 7, No. 3, p. 224, Aug. 1964.
"Semiconductor International", Nov. 1980, pp. 7, 8.

Primary Examiner—John H. Newsome
Attorney, Agent, or Firm—Claude A. S. Hamrick

[57] ABSTRACT

A process for forming a defect-free photomask consisting of an opaque layer overlying a substrate transparent to radiant energy and which comprises applying a coating material which absorbs radiant energy to the surface of a substrate, directing a beam of radiant energy through the substrate onto the coating material so as to fuse the coating material and the substrate at their interface thereby forming an opaque layer on said substrate, and removing from the surface the unfused coating material.

5 Claims, 12 Drawing Figures

DEFECT-FREE PHOTOMASK

CROSS-REFERENCE TO RELATED APPLICATION

This application is a continuation-in-part of my copending U.S. application Ser. No. 160,978, filed June 19, 1980, and entitled "Defect-Free Photomask" now abandoned.

BACKGROUND OF THE INVENTION

1. Field of the Invention

This invention relates to a technique for producing and repairing reticles and photomasks useful in the fabrication of integrated circuits and related devices. More particularly, this invention in one embodiment relates to a technique for producing defect-free photomasks.

2. Description of the Prior Art

Photosensitive resist materials play an important part in the production of monolithic circuits. The use of such photoresist materials is based on their capability in permitting the "engraving" of circuit patterns of specific dimensions in a predetermined monolithic substrate material, as for instance silicon. This is effected by means of a photolithographic process where a two-dimensional pattern corresponding to the circuit design is first imaged on the photoresist coated substrate surface by employing a suitable exposure mask. Through a subsequent developing process, the desired resist patterns are obtained on the substrate surface. In this process, the photoresist serves as a protective system for those areas of the substrate surface that have not been bared by the preceding photolithographic process.

According to their interaction with light, photoresist systems are classified into negative-working and positive-working systems. A negative-working photoresist is one which after exposure is insoluble in a (developing) solvent, whereas the unexposed resist areas are dissolved by the "developer." As a result bared, unprotected areas are obtained on the substrate surface which correspond to the opaque or dark areas on the photomask. In a positive-working resist the photoresist is altered under exposure in such a manner that it is subsequently soluble in the developer. The exposed areas of the resist film are removed during developing, and the bared unprotected areas on the substrate surface correspond to the transparent areas on the photomask. As can be readily appreciated, in either the negative-working or positive-working microphotolithographic systems, the quality of the mask is of vital importance. The mask, like a photographic negative, (or positive) will duplicate any flaw or defect onto the photosensitive resist film.

Defects that reduce the quality of the mask and their yields can be devided into two major categories. The first category is that of opaque defects. These defects obstruct the passage of light preventing the exposure of the photoresist. There have been several methods applied to deal with opaque defects. One such process is to isolate the defect with the aid of a photoresist coating. The resist film protects the adjacent geometries leaving the defect exposed. The defect is then subjected to an etchant that removes it from the mask. Another method employs a laser beam focused onto the defect area, striking the defect with sufficient energy to vaporize it from the substrate. These techniques are commonly used and are adequate in their function. The other major category of defects, that of clear defects, occurs when the geometric pattern of the mask has been interrupted because of loss of material. This allows the exposure of the photoresist in undesired areas.

In an attempt to repair these clear defects, a variety of opaquing techniques have been attempted. In one such process an operator manipulating a tool such as a fine paint brush under a microscope, attempted to apply an opaquing fluid to the damaged part of the mask. This technique is time consuming and has limited application. A further process is one of deposition of a chrome film onto the missing pattern. This is a lengthy and involved procedure that gives inconsistent results.

SUMMARY OF THE INVENTION

It is, therefore, an object of this invention to provide a process that will produce an opaque layer having selected characteristics on the surface of a transparent substrate.

Another object of the invention is to provide a process for repairing transparent defects in the opaque portions of a photomask.

The objects of the invention are achieved by applying a coating that absorbs radiant energy onto a surface of a transparent substrate and then utilizing a laser beam or other source of intense radiant energy to fuse the coating and substrate surface in selected areas. The laser beam provides a source of controlled, localized thermal energy which is passed through the substrate and onto the coating at the interface between the substrate and the coating. The result is that the thermal energy applied to the coating produces a baking of the coating onto the substrate as well as a skin melting of the substrate surface closest to the coating. This baking action, in effect, alters the glass surface from a smooth finish to an irregular one consisting of a mixture of the substrate material and coating material which is capable of interrupting the transmission of light.

Skin-melting of metallic surfaces is described in detail in U.S. Pat. No. 4,122,240, the relevant areas of which are incorporated herein by reference. This surface "damage" is significant enough to scatter or otherwise interfere with the passage of light through the affected portion of the device when it is used in a subsequent microlithographic process. This opaquing technique when used in the repair of clear defect areas in reticles or photomasks, closes such defect areas so as to allow the repaired substrate to be effectively used in further processing operations.

These and other objects of the present invention will become more apparent in light of the following detailed description of the preferred embodiments thereof as illustrated by the accompanying drawing.

IN THE DRAWING

FIG. I is an illustration of the visual appearance of three common types of clear defects in a chrome mask (10× reticle);

FIG. II shows a higher magnification of a clear intrusion into an opaque pattern seen in FIG. I;

FIG. III shows a higher magnification of a broken geometric pattern seen in FIG. I;

FIG. IV shows a higher magnification of a pinhole defect seen in FIG. I;

FIG. V is an illustration of the visual appearance of the defect areas after repair process is completed;

FIG. VI shows the defect area in FIG. II having a different surface character after the repair process is completed;

FIG. VII shows the defect area in FIG. III having a different surface character after repair process is completed;

FIG. VIII shows the defect area in FIG. IV having a different surface character after repair process is completed;

FIG. IX is an illustration of the visual appearance demonstrating the opacity of the invention. Using the repaired 10× reticle shown in FIG. V, a 1× photomask was produced without the defects in FIG. I;

FIG. X is a microphoto of treated area;

FIG. XI is a higher magnification of FIG. X; and

FIG. XII is an illustration of the process of the present invention.

DETAILED DESCRIPTION OF THE EMBODIMENTS

Figure 1:
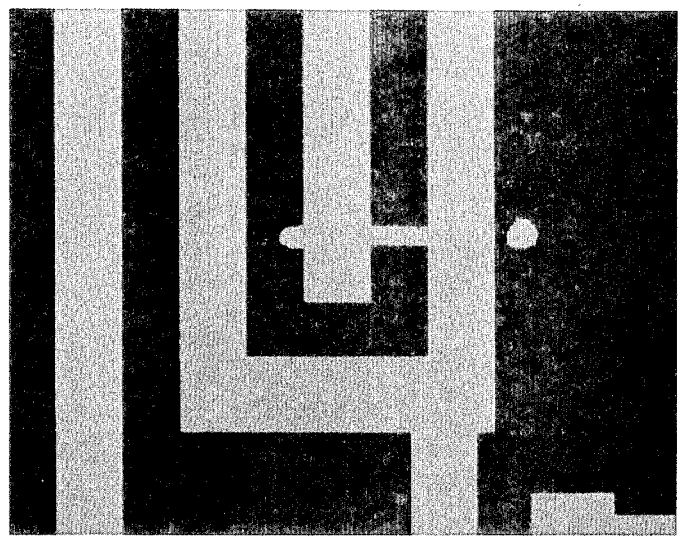
Figure 5:
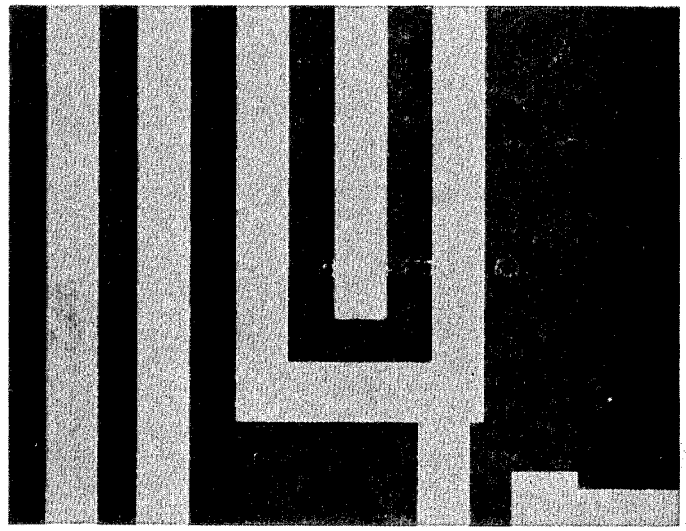
Figure 2:
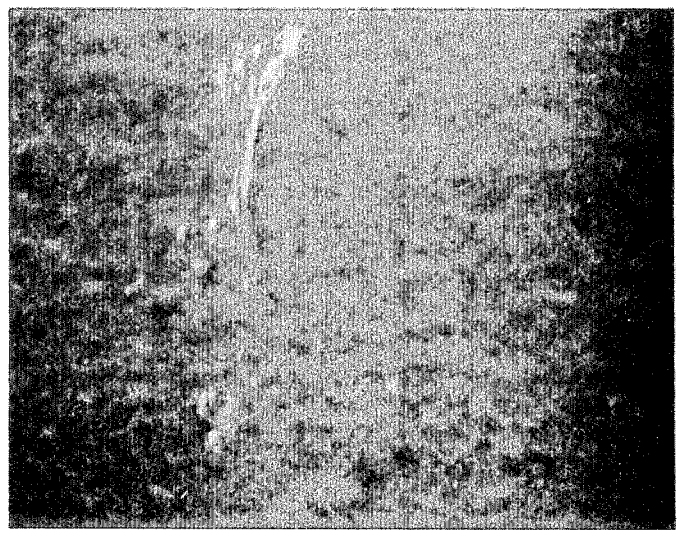
Figure 3:
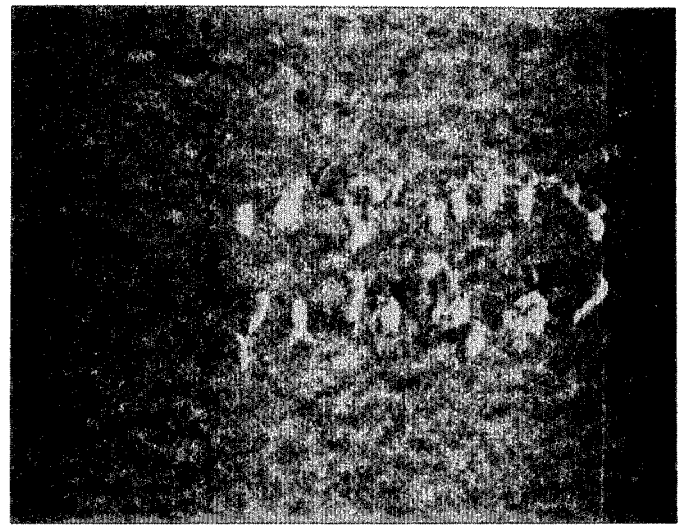
Figure 4:
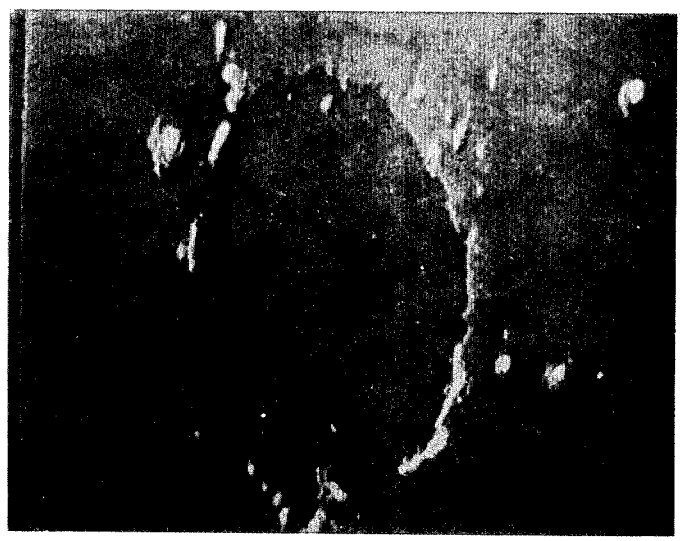
Figure 6:
Figure 7:
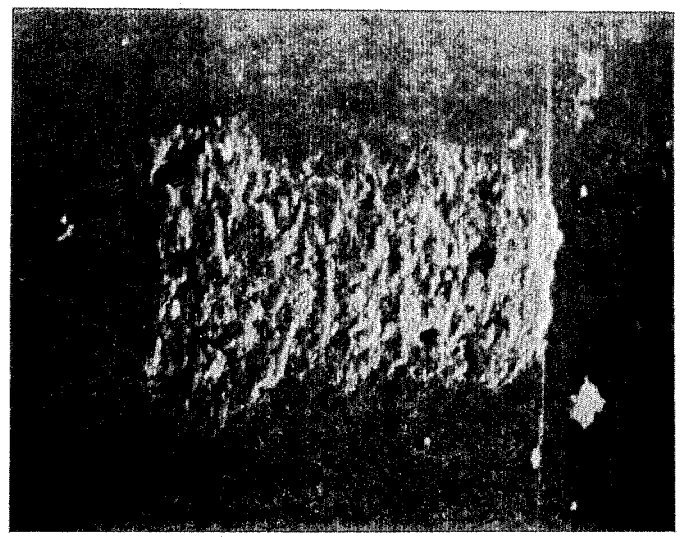
Figure 8:
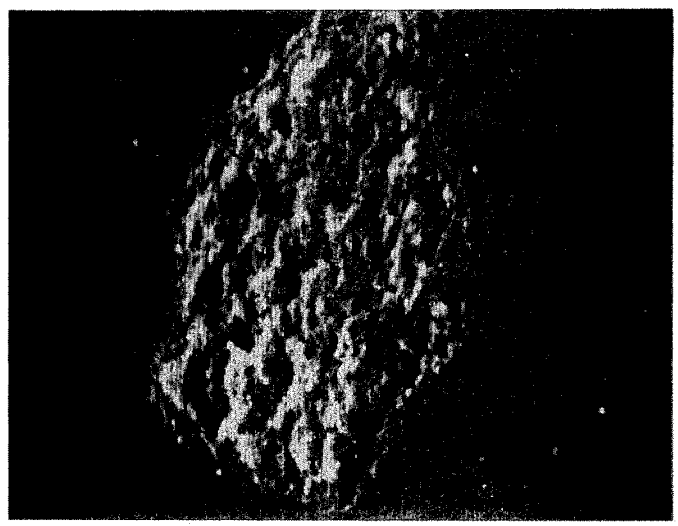
Figure 9:
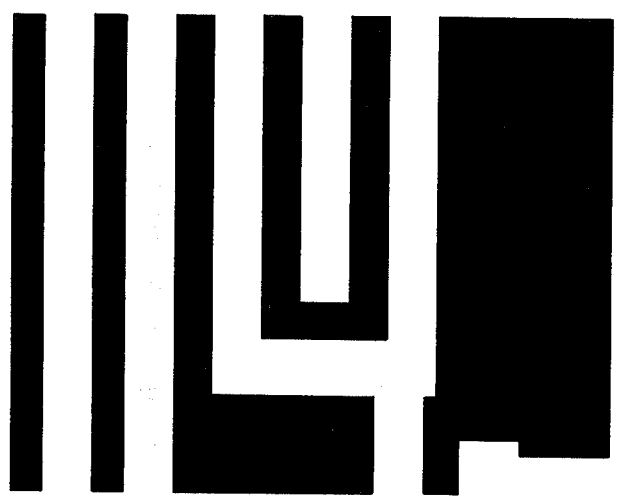
Figure 12:
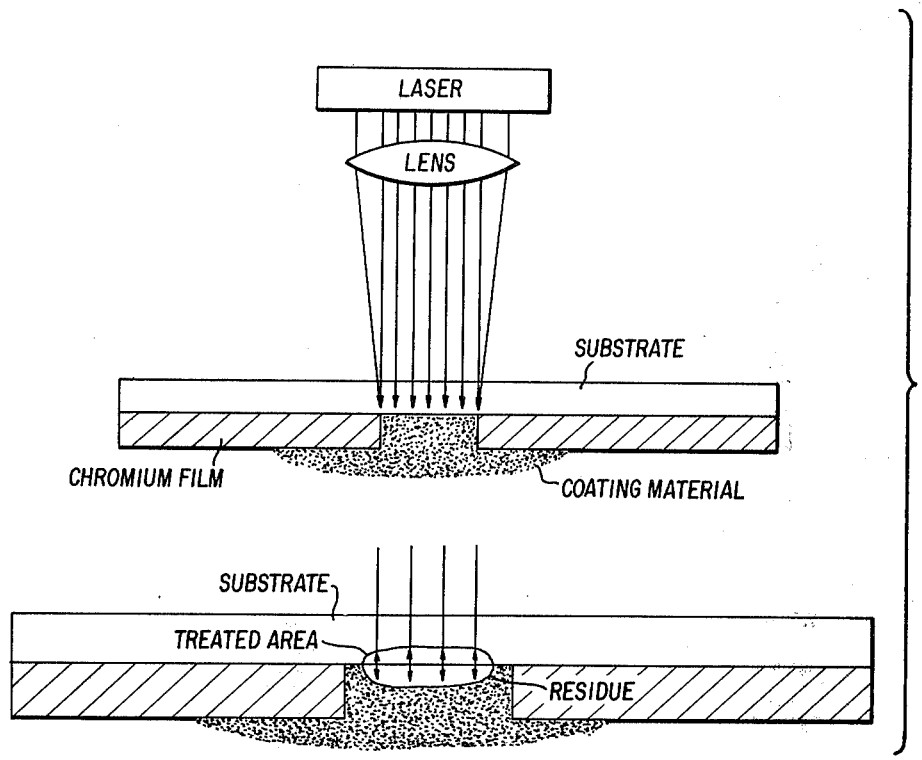
Figure 10:
Figure 11:

A process for forming a defect-free photomask overlying a substrate transparent to radiant energy which comprises applying to a photomask or reticle containing clear defects, a coating material which absorbs radiant energy, directing a beam of coherent or other intense radiant energy through the substrate onto the coating in the clear defect areas so as to fuse the coating and substrate at their interface and form an opaque mixture thereof in the irradiated areas, thereby eliminating the defect in the photomask, and then removing from the photomask surface any unfused coating material.

The coating applied to the defect-containing photomask may be any coating material that absorbs (does not substantially transmit) radiant energy. Its function is to trap and contain the radiant energy which is passed through the substrate material from the source and to convert that energy into heat. This conversion desirably occurs at the interface of the coating and the substrate such that the heat trapped at this interface fuses the coating and the substrate surface. It should be understood that, in cases where the coating is essentially organic in nature, such fusion will, in fact, be more in the form of degradation and carbonation (of the coating) resulting in a highly carbonized residue on the substrate. Inorganic coatings typically will also be fused (melted) but may be preliminarily unaffected if of sufficiently high melting point. In either case, i.e., organic or inorganic coating materials, the heat generated from the beam of radiant energy causes a surface (skin) melting of the substrate material and a concurrent mixing of the melted, degraded or unaffected coating. The end result of such process is that a treated substrate surface results comprising, in the case of organic coatings and inorganic coatings subject to melting in the process, a melted or thermally degraded layer overlying a mixed layer of organic coating/substrate which in turn overlies the "skin-melted" substrate. As disclosed above, the inorganic coatings may be unaffected by the interface heat and, as such, the treated areas of the substrate will be substantially two layers, an inorganic coating/substrate mix overlying a skin-melted substrate layer. In either coating system, however, it has been found that to be effective in obscuring the clear, defect-containing areas, i.e., in changing such areas from clear to opaque, the treated area (coating and substrate mixture) must be at least 400 Å in thickness. Lesser treatment must be of sufficient opacity in the mask to be effective for the purpose intended. Any thickness in excess of 400 Å is therefor satisfactory but economics, e.g., time of repair, etc., become increasingly important as treatment depths increase. Preferably the depth of treated area is 5,000 to 20,000 Å, most preferably 10,000 Å to 15,000 Å.

The coating material should be applied to the substrate in sufficient thickness to act as a barrier to the radiant energy beam supplied by the laser and, as such, can be of any thickness as long as the trapped energy is converted into heat sufficient to effect melting of the substrate surface. In typical coherent energy sources, with power outputs of 50 to 300 microjoules, satisfactory coating thicknesses have been found to be about 300 Å to about 500 microns, preferably 800 Å to 100 microns, most preferably 5 to 35 microns. While power outputs of greater intensity than disclosed herein are capable of producing the desired fused, opaque areas, the amount of thermal energy generated is of such character and intensity as to possibly disrupt adjacent photomask geometries.

On removing the unaffected coating material, a radiation-treated area that is more opaque than the untreated areas results. In cases where the coating is applied to defect-containing areas in a photomask, such greater opacity does not materially affect the subsequent use of the photomask for imaging. However, where the photomask itself is created by the irradiating operation, as described below, a photomask of sharper image formation occurs.

The coatings found of particular use in the process of this invention include those generally known to those skilled in the art as laquers, paints and varnishes, and encompass both the organic and inorganic type coatings normally used for decorative finishing or protective purposes. Such include, for example, enamels, glazes, intremescent coatings, mastics, polishes, waxes, stains, and dyes. The coatings primarily of an organic nature useful herein are those based on styrene butadiene, latexes, starch polymers, cellulose ethers and esters, rosin and modified rosins and resins, urea and melamine resins, vinyl resins and vinyl emulsions. The coatings primarily of an inorganic nature useful herein are those employing pigments of iron oxide, copper and copperous oxide, lead, lead oxide and salts thereof, zinc oxide and salts thereof, titanium dioxide, chrome, chromic oxide and salts thereof, antimony and antimony oxide, aluminum and aluminum oxide, and diatomaceous earth. Metals such as silver, silver oxide and salts thereof, nickel and nickel oxide and salts thereof, gold, gold oxide and salts thereof, mercury, mercury oxide and salts, magnesium, magnesium oxide and salts thereof, lithium, rubidum, cesium, gallium, indium, and thallium. Preferably, the inorganic coatings contain a form of granular cargon, e.g., lampblack, furnace black, carbon black, animal, vegetable and mineral blacks or graphite, most preferably chromic oxide. However, it should be noted that the actual molecular composition of the opaque coatings herein are not critical as long as the coating functions to trap sufficient thermal energy so as to "melt" and fuse the coating/substrate interface as described above. Similarly, the substrates of use herein are typically those employed in the present semiconductor technology and include glass, quartz, silicon, germanium, sapphire, etc. The main criteria for such being only that it be transparent to the radiant energy utilized in the process.

A further embodiment of the present invention contemplates a process for forming a substantially defect-free photomask overlying a substrate transparent to radiant energy which comprises applying to the transparent substrate a coating which absorbs radiant energy; directing a beam of radiant energy through the substrate onto the absorbing coating in a predetermined photomask pattern; fusing the coating/substrate interface; and removing from the substrate surface the unfused coating material. A photomask pattern is thereby provided on the substrate surface without requiring the use of the usual prior art techniques of first coating the substrate surface with a photoresist material, exposing such photoresist through a mask, etc., to obtain a photomask on the surface of a substrate. The radiant energy sources presently available are, of course, readily programmable so as to move in a predetermined (computer-controlled) pattern to effect the desired layout of opaque areas on the substrate surface.

In the following example, the radiant energy generating source is a Florod Manual Zapper I Model LMT. This equipment utilizes a Xenon laser tube which produces a beam that travels down through a microscope top objective. A variable aperture system controls the beam size (1-25 microns) and produces the desired power levels.

EXAMPLE 1

A defective reticle (10× mask) was manufactured with a chromium film and a sodalime glass substrate (3"×3"×.060"), FIGS. I, II, III and IV. The defective area was coated with a fluid comprised of 50% isopropyl alcohol and 50% titanium dioxide pigment. The coating was applied by means of a cotton swab and allowed to dry. (Coating thickness varied between 35 microns to 45 microns.) Coherent radiation from the laser was applied to the defective portion of the mask, the laser beam size being 15 microns in diameter at 5 pulses a second with each pulse lasting for one microsecond, the power supply being set at 3,000 volts to generate approximately 40 electron volts in the laser tube. The glass surface was then cleaned with acetone and examined under a microscope. The results shown in FIGS. V, VI, VII and VIII show that the glass surface and the coating material have fused and intermingled giving a highly opaque surface.

The reticle was next subjected to a cleaning process. It was subsequently submerged in chromic acid for 30 minutes at 45° C. in an attempt to remove the residue. The adhesion of the material to the glass was found to be good through the cleaning processes.

Using a film thickness analyzer (Tencore Alpha Step) the surface texture was examined. The resulting measurement determined that the laser burned valleys into the glass surface up to 5,000 Å. It was also observed that the treated area formed a "coating" approximately 10,000 Å thick on the substrate (FIGS. XI and XII).

The reticle was then mounted into a David Mann/GCA 3095 Photorepeater. This equipment used a 10× reduction lens and a 350 watt Merc Arc Lamp to produce ultraviolet light at 436 nanometers. This optical system reduces the image on the reticle ten times, projecting it onto a photoresist coated substrate. It is used here to test the opacity of the treated area. An exposure matrix was performed to test this interaction under different exposures. An exposure series was started at one second, progressing to five seconds in half second intervals with a light intensity of 225 mw/cm$^2$ at the image plane. Under both low and high exposures, the surface treatment of the present invention shielded the photoresist from light. FIG. IX illustrates the results with a nominal exposure time of two seconds.

While the invention has been particularly shown and described with reference to certain preferred embodiments, it will be understood by those skilled in the art that various alterations and modifications in form and detail may be made therein. Accordingly, it is intended that the following claims cover all such alterations and modifications as fall within the true spirit and scope of the invention.

What is claimed is:

1. A process for repairing transparent defects in a photomask consisting of a defect containing opaque layer overlying a substrate which is transparent to radiant energy, comprising:

applying a coating material which absorbs radiant energy to the opaque layer and over the transparent defect;

directing a beam of radiant energy through the substrate and onto said coating in the defect areas, said beam containing sufficient radiant energy to fuse the material at the interface of the substrate and the coating material such that the fusing operation forms a layer of an opaque mixture obscuring the defect area thereby eliminating the defect in the photomask; and removing from the photomask surface the unfused coating material.

2. The process as recited in claim 1 wherein said fused interface is at least 400 Å in thickness.

3. The product made by the process of claim 2.

4. A process for forming a defect-free photomask overlying a substrate transparent to a beam of radiant energy, comprising:

applying to a surface of a transparent substrate a coating material which absorbs radiant energy;

directing a beam of radiant energy through said substrate and onto said coating material in a predetermined pattern so as to fuse the materials at the coating/substrate interface and form an opaque mixture defining said photomask; and removing from the substrate surface the unfused coating material.

5. The product made by the process of claim 4.

* * * * *